United States Patent
Liu et al.

(10) Patent No.: US 9,805,997 B2
(45) Date of Patent: Oct. 31, 2017

(54) PACKAGING METHODS FOR SEMICONDUCTOR DEVICES WITH ENCAPSULANT RING

(71) Applicant: Taiwan Semiconductor Manufacturing Company, Ltd., Hsin-Chu (TW)

(72) Inventors: Yu-Chih Liu, Taipei (TW); Chien-Kuo Chang, Zhubei (TW); Wei-Ting Lin, Taipei (TW); Kuan-Lin Ho, Hsin-Chu (TW); Chin-Liang Chen, Kaohsiung (TW); Shih-Yen Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/334,433

(22) Filed: Jul. 17, 2014

(65) Prior Publication Data
US 2015/0214074 A1    Jul. 30, 2015

Related U.S. Application Data

(60) Provisional application No. 61/932,055, filed on Jan. 27, 2014.

(51) Int. Cl.
*H01L 21/00* (2006.01)
*H01L 23/24* (2006.01)
*H01L 23/31* (2006.01)

(52) U.S. Cl.
CPC .......... *H01L 23/24* (2013.01); *H01L 23/3128* (2013.01); *H01L 2224/16225* (2013.01); *H01L 2924/0002* (2013.01); *H01L 2924/15311* (2013.01)

(58) Field of Classification Search
CPC . H01L 21/56; H01L 23/58; H01L 2924/0002; H01L 2924/00; H01L 2224/16225; H01L 23/24; H01L 23/3128; H01L 2924/15311
USPC .......................... 438/107, 108, 124; 257/692
See application file for complete search history.

(56) References Cited

U.S. PATENT DOCUMENTS

| | | | |
|---|---|---|---|
| 6,046,077 A * | 4/2000 | Baba ..................... | H01L 21/563 257/E21.503 |
| 6,359,335 B1 * | 3/2002 | Distefano ............... | H01L 21/56 257/684 |
| 6,762,509 B2 * | 7/2004 | Hilton .................... | H01L 21/563 257/787 |
| 2004/0150118 A1 * | 8/2004 | Honda ................... | H01L 21/563 257/778 |
| 2006/0274517 A1 * | 12/2006 | Coffy .................... | H01L 21/561 361/816 |
| 2008/0093733 A1 * | 4/2008 | Hsu ....................... | H01L 21/563 257/722 |
| 2012/0018871 A1 * | 1/2012 | Lee ....................... | H01L 25/0655 257/698 |

(Continued)

*Primary Examiner* — Duy T Nguyen
(74) *Attorney, Agent, or Firm* — Slater Matsil, LLP

(57) ABSTRACT

Packaging methods for semiconductor devices, and packaged semiconductor devices are disclosed. In some embodiments, a method of packaging a semiconductor device includes coupling a ring to a substrate, and coupling an integrated circuit die to the substrate within the ring. A molding material is disposed around the integrated circuit die within the ring.

19 Claims, 7 Drawing Sheets

(56) References Cited

U.S. PATENT DOCUMENTS

2013/0109136 A1* 5/2013 Foote .................. H01L 24/83
            438/115
2013/0320518 A1* 12/2013 Chun .................. H01L 23/34
            257/712

* cited by examiner

PACKAGING METHODS FOR SEMICONDUCTOR DEVICES WITH ENCAPSULANT RING

PRIORITY CLAIM AND CROSS-REFERENCE

This application claims priority to U.S. Provisional Application Ser. No. 61/932,055, filed on Jan. 27, 2014 and entitled, "Warpage Controlled Package and Methods of Forming Same," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
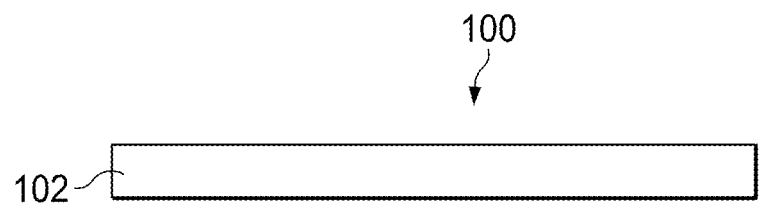
FIGS. 1 through 6 are cross-sectional views illustrating a method of packaging a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide novel methods of packaging semiconductor devices and structure thereof wherein a ring and a molding material are disposed around an integrated circuit die over a substrate. The ring and molding material provide warpage control. The robust package structures reduce stress on the integrated circuit die, enhance reliability lifetime, and increase yields. Some contemplated embodiments employ both a ring and appropriate use of a molding material to achieve improved warpage control performance. Other embodiments include a lid for heat-spreading for the integrated circuit die and package.

FIGS. 1 through 6 are cross-sectional views illustrating a method of packaging a semiconductor device in accordance with some embodiments. Referring first to FIG. 1, a substrate 102 is provided. The substrate 102 comprises a packaging substrate. The package substrate 102 comprises a flip-chip package substrate in accordance with some embodiments. The substrate 102 may comprise a semiconductor material, glass fiber, resin, a filler, other materials, and/or combinations thereof, in some embodiments, for example. In some embodiments, the substrate 102 may include one or more passive components (not shown) embedded inside. In some embodiments, a plurality of substrates 102 may be manufactured on a wafer, board, or strip, and the substrates 102 are singulated to form individual substrates 102, for example. The substrate 102 may comprise an interposer substrate in some embodiments. The substrate 102 may include one or more interconnect structures, such as redistribution layers (RDLs) or post-passivation interconnect (PPI) structures (not shown; see FIG. 12).

The substrate 102 may include a plurality of through-vias formed therein. Alternatively, the substrate 102 may comprise other materials and/or components.

The substrate 102 includes an integrated circuit die mounting region 100. The integrated circuit die mounting region 100 is located in a substantially central region of the substrate 102. Alternatively, the integrated circuit die mounting region 100 may be offset from a central region of the substrate 102.

Figure 2:
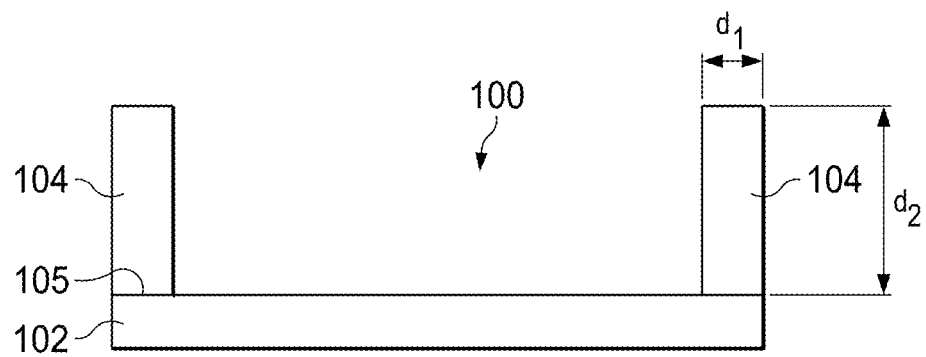

A ring 104 is coupled to the substrate 102, as shown in FIG. 2. The ring 104 is attached to a first surface, e.g., the top surface in FIG. 2, of the substrate 102. The ring 104 comprises a supportive material such as a metal, a ceramic, or combinations or multiple layers thereof, as examples. The ring 104 comprises a width along the sides of the ring 104 in a cross-sectional view comprising dimension $d_1$ of about 0.1 millimeters (mm) to about 5.0 mm and a height in the cross-sectional view comprising dimension $d_2$ of about 0.1 mm to about 1.2 mm, as examples. The ring 104 comprises a material and dimensions $d_1$ and $d_2$ sufficient to provide an adequate support function and warpage control, and also to reduce mechanical strain for a packaged integrated circuit die 106 (see FIG. 3) during an operation of the packaged semiconductor device 120 (see FIG. 6), during transportation of the packaged semiconductor device 120, or during a packaging process for the integrated circuit die 106 in some embodiments, as examples. Alternatively, the ring 104 may comprise other materials and dimensions.

The ring 104 is coupled to the substrate 102 using an adhesive or tape 105, as examples. The ring 104 is coupled in a perimeter region of the substrate 102 around the integrated circuit die mounting region 100. The ring 104 is coupled proximate the perimeter of the substrate 102 in some embodiments, for example, in a substantially perimeter region of the substrate 102. The ring 104 may be coupled to the substrate 102 using a pick-and-place machine, manually, or by other methods.

Figure 3:
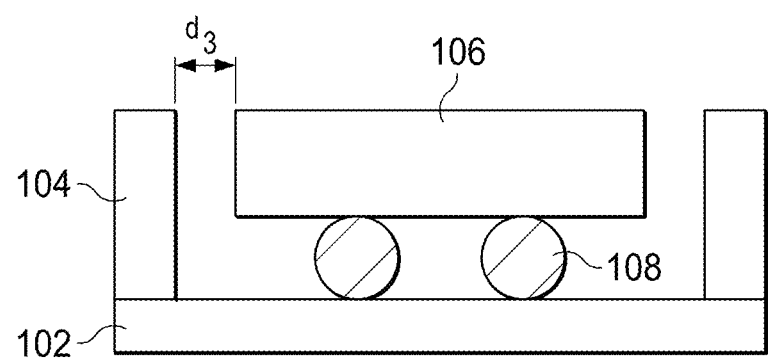

An integrated circuit die 106 is coupled to the integrated circuit die mounting region 100 of the substrate 102, as shown in FIG. 3. The integrated circuit die 106 is coupled to the integrated circuit die mounting region 100 of the substrate 102 within the ring 104. The integrated circuit die 106 is coupled to the first surface (e.g., the top surface in FIG. 3) of the substrate 102 in a region surrounded by the ring 104.

The integrated circuit die 106 is coupled to the substrate 102 using a flip-chip mounting process in some embodiments. For example, a plurality of connectors 108 may be disposed on or attached to a top surface of the integrated circuit die 106, the integrated circuit die 106 is inverted, and the plurality of connectors 108 is coupled to the substrate 102. The integrated circuit die 106 may be coupled to the substrate 102 using a pick-and-place machine or manually, as examples. Alternatively, other methods may be used to attach the integrated circuit die 106 to the substrate 102. The connectors 108 comprise a eutectic material that is re-flowed by heating the substrate 102 and integrated circuit die 106, and the eutectic material is cooled and solidified, which bonds the integrated circuit die 106 to the substrate 102, for example. The connectors 108 may comprise controlled collapse chip connection (C4) connectors or solder balls, as an example. Alternatively, the connectors 108 may comprise other types of connectors.

Figure 4:
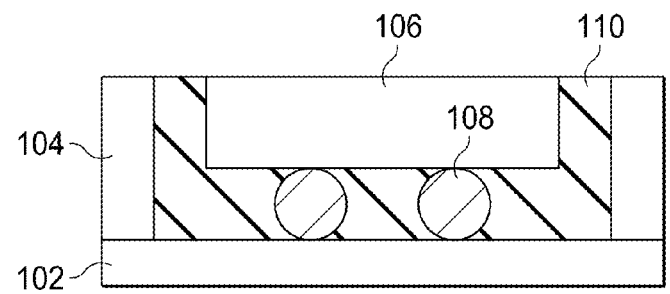

A molding material 110 is disposed around the integrated circuit die 106 within the ring 104, as shown in FIG. 4. The molding material 110 is disposed around the integrated circuit die 106 after coupling the ring 104 to the substrate 102, in some embodiments. In other embodiments, the molding material 110 is disposed around the integrated circuit die 106 before coupling the ring 104 to the substrate 102, not shown in the drawings. The molding material 110 may be transfer molded or compression molded, as examples. The molding material 110 is formed between the edges of the integrated circuit die 106 and the ring 104 within the region within the ring 104 over the substrate 102. Alternatively, the molding material 110 may be applied using other methods.

The molding material 110 comprises a molding compound, an underfill material, or a combination thereof, in some embodiments. In some embodiments, the molding material 110 comprises an underfill material comprising a molded underfill material, for example.

The molding material 110 fills spaces between the integrated circuit die 106 and the ring 104, and encapsulates the integrated circuit die 106, for example. The molding material 110 may comprise an epoxy, an organic polymer, or a polymer with or without a silica-based or glass filler added, as examples. In some embodiments, the molding material 110 comprises a liquid molding compound (LMC) that is a gel type liquid when applied. Alternatively, the molding material 110 may comprise other insulating and/or encapsulating materials.

If the molding material 110 extends over a top surface of the integrated circuit die 106, the molding material 110 is removed in some embodiments from over the top surface of the integrated circuit die 106 using a chemical-mechanical polish (CMP), etch process, or other methods in some embodiments, for example. The CMP process is adapted to stop on the ring 104, for example. In other embodiments, the molding material 110 may be left remaining over the top surface of the integrated circuit die 106. The molding material 110 is formed around the integrated circuit die 106 in some embodiments, within the ring 104.

Figure 5:
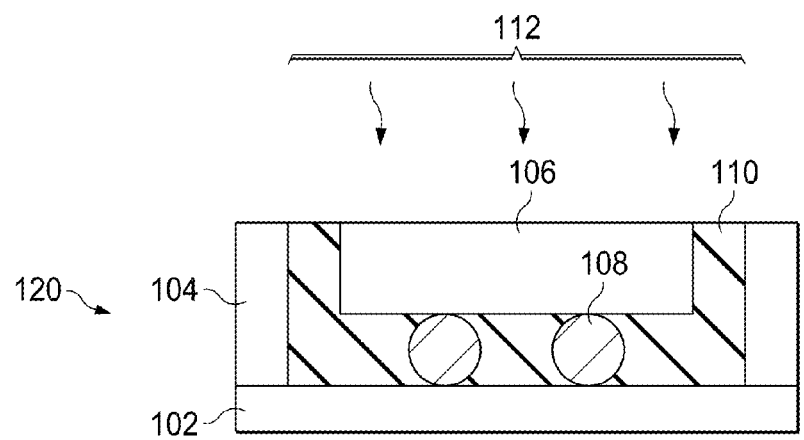

Next, the molding material 110 is cured, as shown in FIG. 5, using a curing process 112. The curing process 112 may comprise heating the molding material 110 to a predetermined temperature for a predetermined period of time, using an anneal process or other heating process. The curing process 112 may also comprise an ultra-violet (UV) light exposure process, an infrared (IR) energy exposure process, combinations thereof, or a combination thereof with a heating process. Alternatively, the molding material 110 may be cured using other methods.

Figure 6:
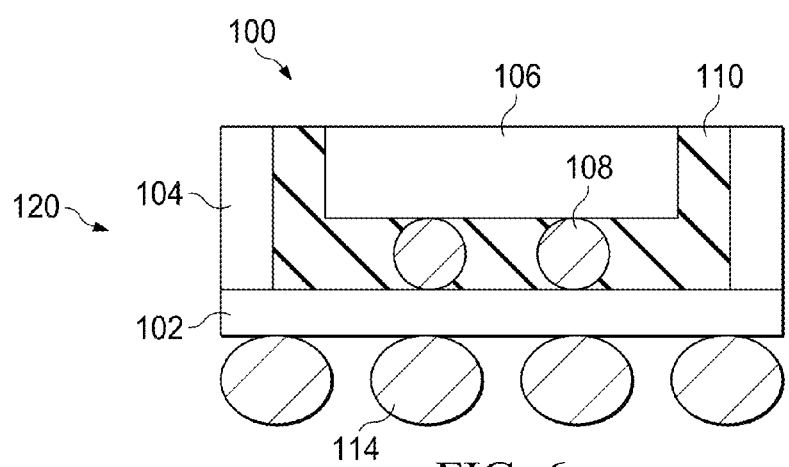

In some embodiments, a plurality of connectors 114 are then coupled to the substrate 102, as shown in FIG. 6. The plurality of connectors 114 are coupled to a second surface (e.g., the bottom surface of the substrate 102 in the view shown in FIG. 6) of the substrate 102 that is opposite the first surface of the substrate 102. The plurality of connectors 114 may comprise a eutectic material such as solder, and may comprise solder balls in some embodiments. The connectors 114 may be attached using a ball drop process or a solder bath, as example. Alternatively, the connectors 108 may comprise other types of connectors and may be attached using other methods, or the connectors 108 may not be included on the packaged semiconductor device 120.

Thus, FIG. 6 illustrates a packaged semiconductor device 120 that includes the substrate 102 having an integrated circuit die mounting region 100, the ring 104 coupled to the substrate 102 around the integrated circuit die mounting region 100, and an integrated circuit die 106 coupled to the integrated circuit die mounting region 100 of the substrate 102 within the ring 104. The packaged semiconductor device 120 includes the molding material 110 disposed over the substrate 102 around the integrated circuit die 106 within the ring 104.

Figure 7:
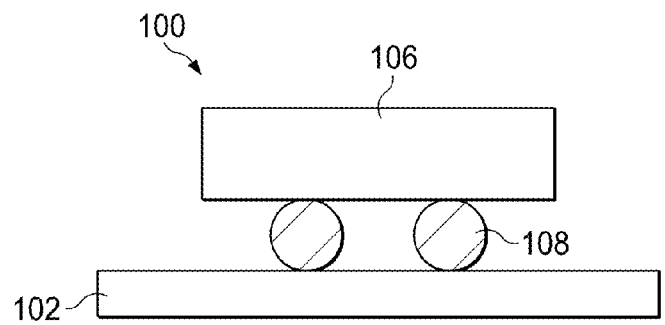
FIGS. 7 and 8 are cross-sectional views illustrating a method of packaging a semiconductor device in accordance with some embodiments.
Figure 8:
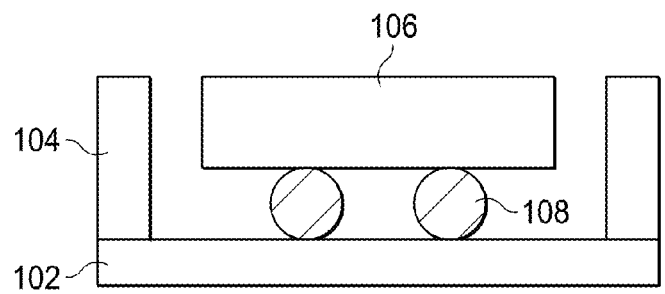

In some embodiments, a method of packaging an integrated circuit die 106 comprises first, coupling the ring 104 to the substrate 102, and second, coupling the integrated circuit die 106 to the substrate 102, as shown in FIGS. 1 through 6. The presence of the ring 104 coupled to the substrate 102 during the coupling of the integrated circuit die 106 to the substrate 102 advantageously assists in the guiding, alignment, placement, and positioning of the integrated circuit die 106. In other embodiments, a method of packaging an integrated circuit die 106 comprises first, coupling the integrated circuit die 106 to the substrate 102, and second, coupling the ring 104 to the substrate 102, as shown in FIGS. 7 and 8. The presence of the integrated circuit die 106 coupled to the substrate 102 during the coupling of the ring 104 to the substrate 102 advantageously assists in the guiding, alignment, placement, and positioning of the ring 104.

The ring 104 advantageously functions as a dam to contain the molding material 110 within the ring 104 in embodiments wherein the ring 104 is attached to the substrate 102 prior to applying the molding material 110, for example. In other embodiments, the molding material 110 is applied around the integrated circuit die 106 before the ring 104 is attached, not shown in the drawings.

FIGS. 7 and 8 are cross-sectional views illustrating some embodiments wherein the integrated circuit die 106 is first coupled to the substrate 102, and second, the ring 104 is coupled to the substrate 102. After the packaging process step shown in FIG. 1 of providing the substrate 102, an integrated circuit die 106 is coupled to the substrate 102 in the integrated circuit die mounting region 100 of the substrate 102, as shown in FIG. 7. The ring 104 is then coupled to the substrate 102 around the integrated circuit die 106, as shown in FIG. 8. The methods of attaching the integrated circuit die 106 and ring 104 may comprise similar methods as described for the embodiments shown in FIGS. 2 and 3, for example. The packaging methods described herein with reference to FIGS. 4 through 6 are then performed to complete the packaging of the semiconductor device.

Figure 9:
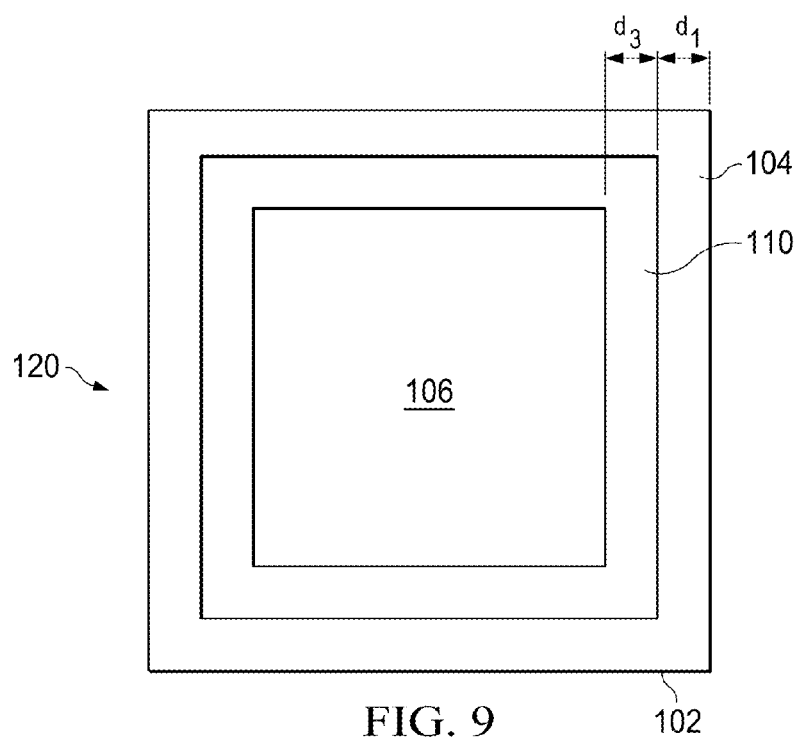
FIGS. 9 and 10 are top views of packaged semiconductor devices in accordance with some embodiments.
Figure 10:
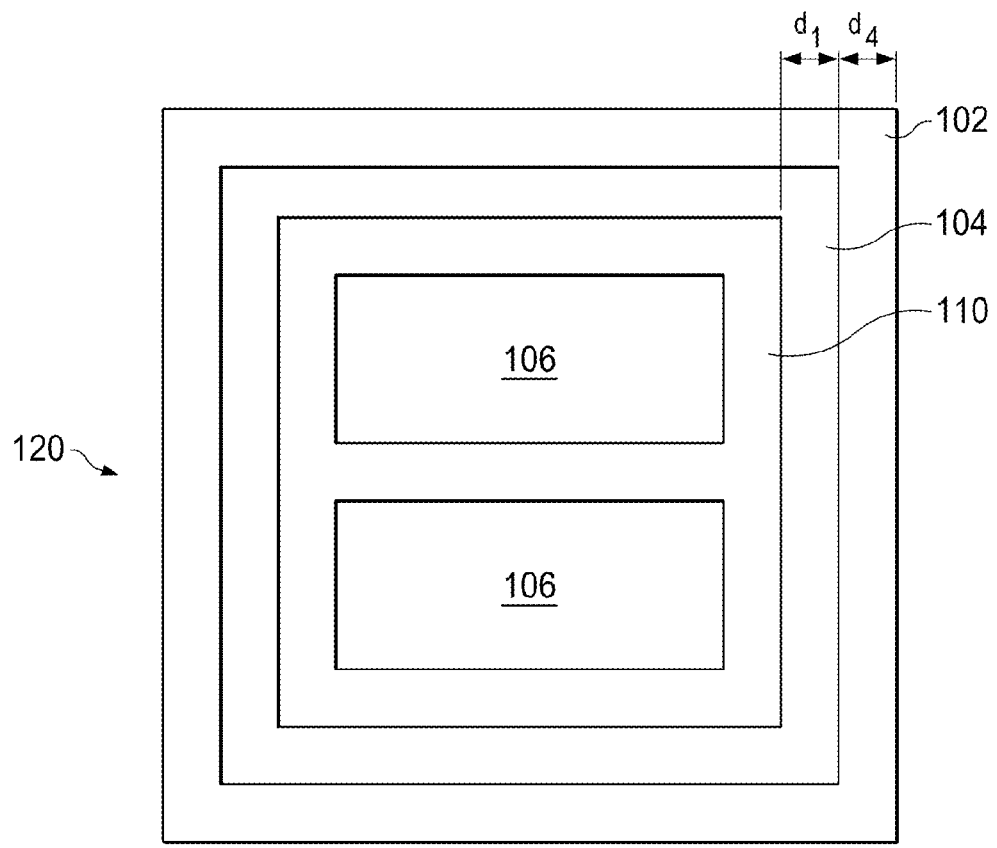

FIGS. 9 and 10 are top views of packaged semiconductor devices 120 in accordance with some embodiments. The packaged semiconductor device 120 shown in FIG. 9 comprises one integrated circuit die 106 disposed within the ring 104 over the substrate 102. The ring 104 comprises a substantially square or rectangular shape in the top view and is attached proximate the perimeter of the substrate 102. Alternatively, the ring 104 may comprise other shapes, and the ring 104 may be positioned in other locations on the substrate 102. Outer edges of the ring 104 are substantially aligned with the perimeter of the substrate 102 in the embodiments shown in FIG. 9. The molding material 110 fills the spaces between the ring 104 and the integrated circuit die 106.

FIG. 10 illustrates some embodiments wherein a plurality of integrated circuit dies 106 are coupled to the substrate 102 within the ring 104. Only two integrated circuit dies 106 are shown in FIG. 10; alternatively, three or more integrated circuit dies 106 may be attached to the substrate 102 within the ring 104. Thus, advantageously, two or more integrated circuit dies 106 may be packaged together in accordance with some embodiments of the present disclosure. The molding material 110 fills the spaces between the ring 104 and the integrated circuit dies 106, and also fills the spaces between adjacent integrated circuit dies 106.

FIG. 10 also illustrates some embodiments wherein the ring 104 is attached proximate the perimeter of the substrate 102, yet the outer edges of the ring 104 are not substantially aligned with the perimeter of the substrate 102. A portion of the substrate 102 is visible in the top view along the edges of the packaged semiconductor device 120. The outer edges of the ring 104 may be spaced apart from the perimeter of the substrate 102 by an amount comprising dimension $d_4$, wherein $d_4$ comprises about 0.1 mm to about 5 mm, for example. Alternatively, dimension $d_4$ may comprise other values. In some embodiments, one or more outer edges of the ring 104 may be spaced apart from the perimeter, and one or more outer edges of the ring 104 may not be spaced apart from the perimeter.

Figure 11:
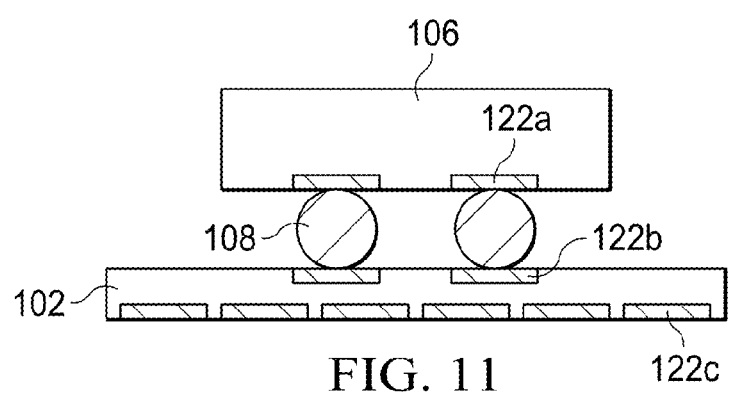
FIG. 11 is a cross-sectional view of a portion of a packaged semiconductor device in accordance with some embodiments.

FIG. 11 is a cross-sectional view of a portion of a packaged semiconductor device in accordance with some embodiments, prior to the attachment of the ring 104 or application of the molding material 110. FIG. 11 is a more detailed view of the embodiment and packaging step shown in FIG. 7, for example. The integrated circuit die 106 is coupled to the substrate 102 by a plurality of connectors 108 disposed between contact pads 122a on the integrated circuit die 106 and contact pads 122b on the substrate 102. The contact pads 122a and 122b are arranged in a ball grid array (BGA) pattern that is fully or partially populated, for example. Alternatively, the contact pads 122a and 122b may be arranged in other patterns. In some embodiments, the substrate 102 includes a plurality of contact pads 122c disposed on a bottom surface thereof. The connectors 114 (not shown in FIG. 11; see FIG. 6) can be coupled to the contact pads 122c on the bottom of the substrate 102, for example. The contact pads 122c may be spaced farther apart from one another than the contact pads 122a and 122b are spaced apart in some embodiments. The substrate 102 may include fan-out wiring (not shown in FIG. 11; see interconnect structures 126a and 126b in FIGS. 12 and 13) to provide a wider footprint for the contact pads 122c than a footprint of contact pads 122a and 122b, in some embodiments, for example.

Figure 12:
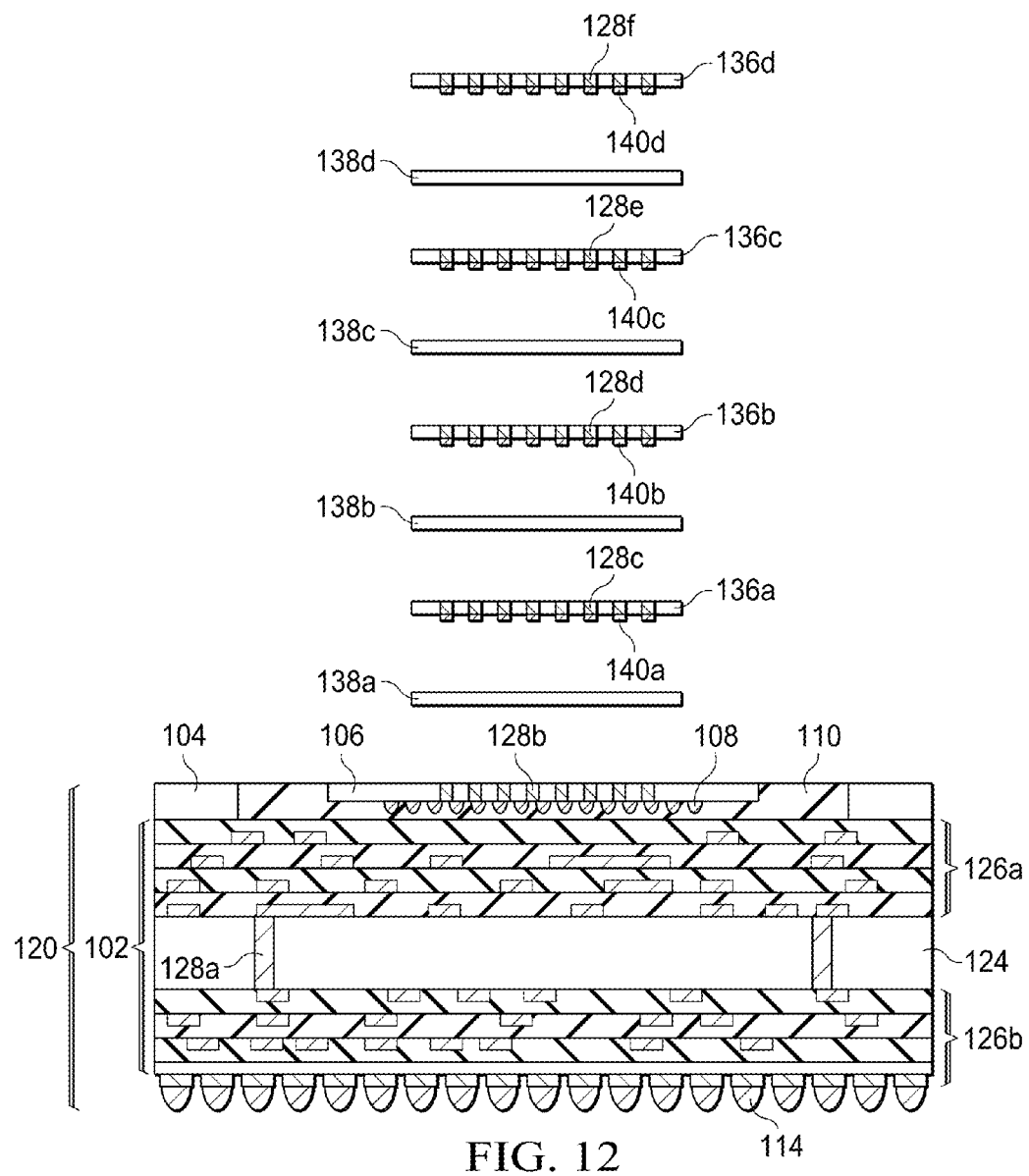
FIGS. 12 and 13 are cross-sectional views of a packaged semiconductor device coupled to integrated circuit dies in a three-dimensional integrated circuit (3DIC) scheme in accordance with some embodiments.
Figure 13:
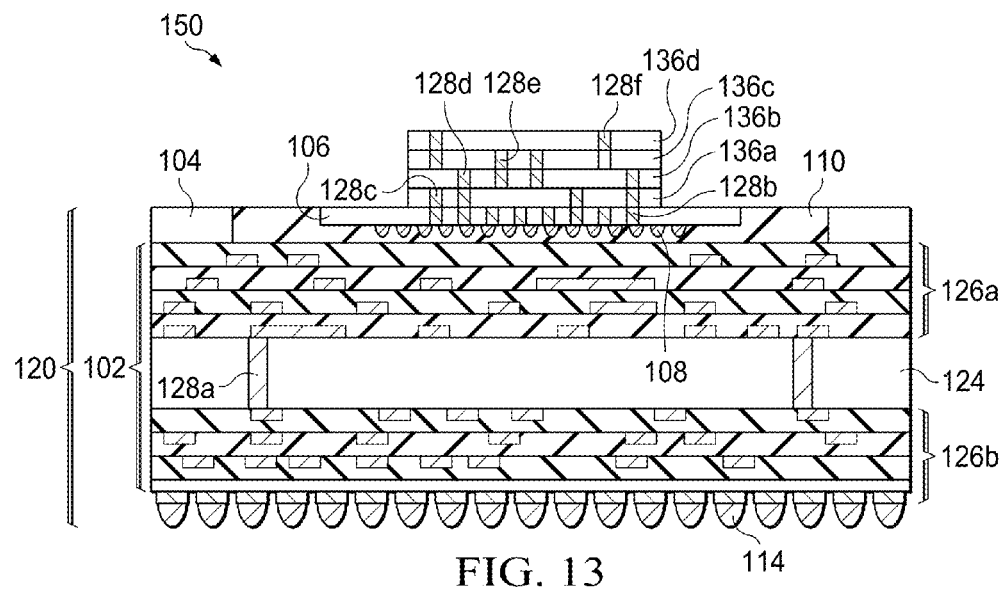

FIGS. 12 and 13 are cross-sectional views of a packaged semiconductor device 120 that is coupled to integrated circuit dies 136a, 136b, 136c, and/or 136d in a 3DIC scheme in accordance with some embodiments. Additional details and components of a substrate 102 in accordance with some embodiments are also shown. The substrate 102 includes a substrate core 124 and a first interconnect structure 126a disposed on a top side of the substrate core 124. The first interconnect structure 126a includes a plurality of conductive features disposed in a plurality of insulating layers. The conductive features comprise conductive lines, vias, and/or contact pads, for example. Connectors 108 are disposed on the integrated circuit die 106 and are coupled to contact pads of the first interconnect structure 126a. A second interconnect structure 126b which also includes a plurality of conductive features is disposed on a bottom side of the substrate core 124. The first interconnect structure 126a and second interconnect structure 126b comprise horizontal electrical connections for the packaged semiconductor device 120, and may comprise RDLs or PPIs, as examples. Connectors 114 are coupled to contact pads of the second interconnect structure 126b. The substrate 102 includes a plurality of through-vias 128a formed within the substrate core 124. The through-vias 128a are coupled between conductive features in the first interconnect structure 126a and the second interconnect structure 126b and provide vertical electrical connections for the packaged semiconductor device 120. In some embodiments, the integrated circuit die 106 shown in FIGS. 12 and 13 may be similar to an integrated circuit die 106 described elsewhere, such as shown in FIG. 4-11, 14, 16, or 17. The integrated circuit die 106 may also include a plurality of through-vias 128b formed therein. Alternatively, the integrated circuit die 106 may not include through-vias 128b.

The ring 104 is coupled over the first interconnect structure 126a of the substrate 102. In embodiments wherein the ring 104 comprises a conductive material, such as a metal, an insulating material may be disposed between the first interconnect structure 126a and the ring 104, for example. The ring 104 and molding material 110 are employed to reduce warpage of the resulting structure.

One or more integrated circuit dies 136a, 136b, 136c, and/or 136d may be coupled to the integrated circuit die 106 in accordance with some embodiments. For example, four integrated circuit dies 136a, 136b, 136c, and 136d are illustrated in FIG. 12 which are each attached sequentially in a stack over the top surface of integrated circuit die 106 by an adhesive such as a non-conductive paste (NCP) 138a, 138b, 138c, and 138d, respectively. The integrated circuit dies 136a, 136b, 136c, and 136d may alternatively be coupled to the integrated circuit die 106 and/or to each other by other types of materials. The integrated circuit dies 136a, 136b, 136c, and 136d include through-vias 128c, 128d, 128e, and 128f, respectively, formed therein that provide vertical electrical connections for the integrated circuit dies 136a, 136b, 136c, and 136d and provide vertical electrical connections with the integrated circuit die 106. The integrated circuit dies 136a, 136b, 136c, and 136d may comprise memory chips or other functional types of devices, as examples.

Other structures can likewise benefit from the packaging process flows and structures described herein.

FIG. 13 illustrates a packaged semiconductor device 150 that includes the packaged semiconductor device 120 described herein coupled to the stacked integrated circuit dies 136a, 136b, 136c, and 136d. The packaged semiconductor device 150 may comprise a package-on-package (PoP) device or a 3DIC, for example. In some embodiments, the integrated circuit die 106 comprises a first integrated circuit die, and the packaged semiconductor device 150 further comprises a second integrated circuit die 136a, 136b, 136c, and/or 136d coupled to the first integrated circuit die 106. In some embodiments, the packaged semiconductor device 150 comprises a plurality of the second integrated circuit dies 136a, 136b, 136c, and/or 136d coupled over the first integrated circuit die 106, wherein each of the plurality of second integrated circuit dies 136a, 136b, 136c, and/or 136d is coupled to adjacent ones of the plurality of second integrated circuit dies 136a, 136b, 136c, and/or 136d in a stack.

Figure 14:
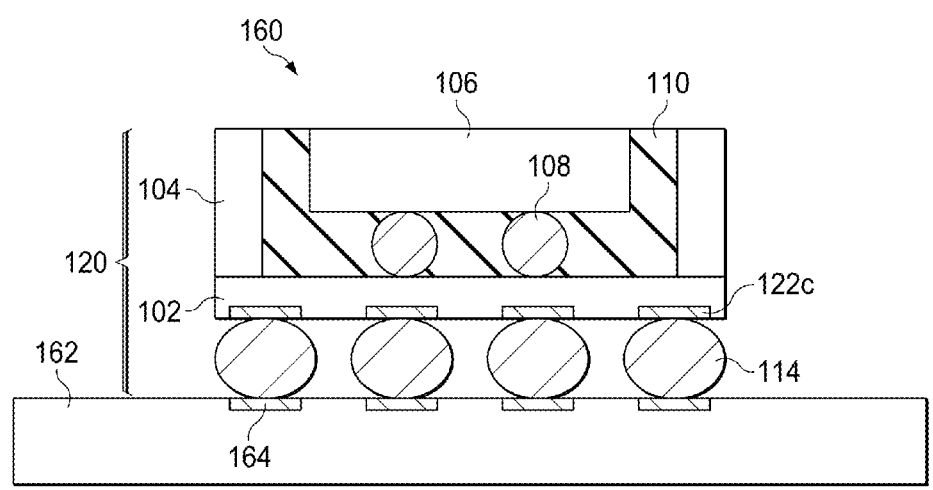
FIG. 14 is a cross-sectional view of a packaged semiconductor device coupled to a packaging substrate in accordance with some embodiments.

FIG. 14 is a cross-sectional view of a packaged semiconductor device 160 coupled to a packaging substrate 162 in accordance with some embodiments. Connectors 114 of a packaged semiconductor device 120 described herein are coupled to contact pads 164 on the packaging substrate 162. A plurality of the connectors 114 are coupled between contact pads 164 on the packaging substrate 162 and contact pads 122c on the substrate 102. In some embodiments, the substrate 102 comprises a first packaging substrate, and the first packaging substrate 102 is coupled to a second packaging substrate 162 by the plurality of connectors 114. The substrate 102 is mounted to the second packaging substrate 162 using a ball mount process in some embodiments.

Figure 15:
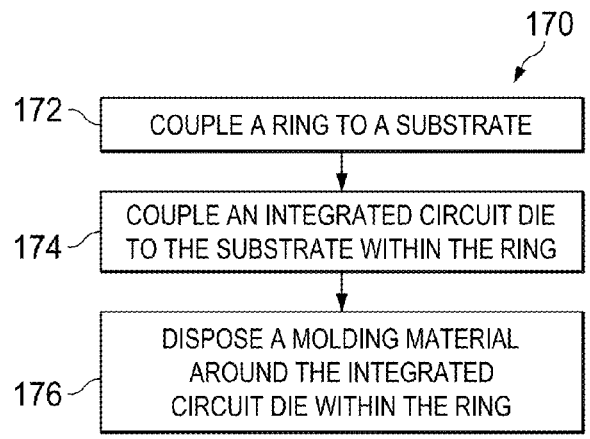
FIG. 15 is a flow chart of a method of packaging a semiconductor device in accordance with some embodiments.

FIG. 15 is a flow chart 170 of a method of packaging a semiconductor device in accordance with some embodiments. In step 172, a ring 104 is coupled to a substrate 102 (see also FIG. 2). In step 174, an integrated circuit die 106 is coupled to the substrate 102 within the ring 104 (FIG. 3). In step 176, a molding material 110 is disposed around the integrated circuit die 106 within the ring 104 (FIG. 4).

Figure 16:
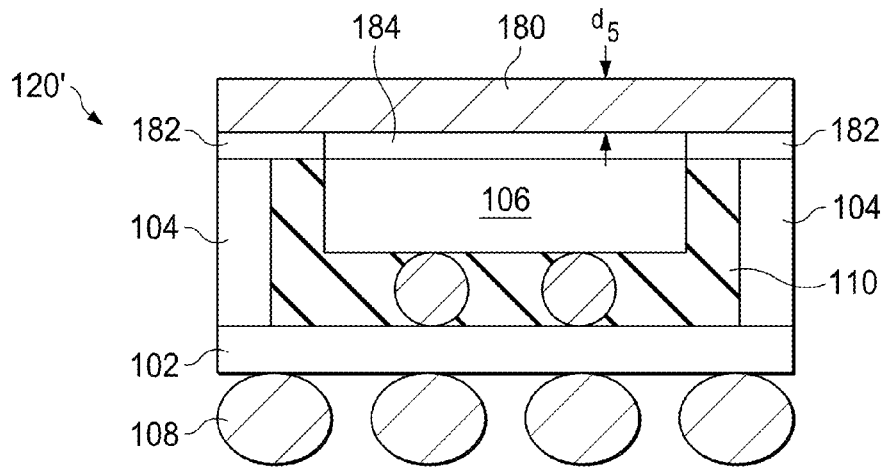
FIGS. 16 and 17 are cross-sectional views of packaged semiconductor devices in accordance with some embodiments.
Figure 17:
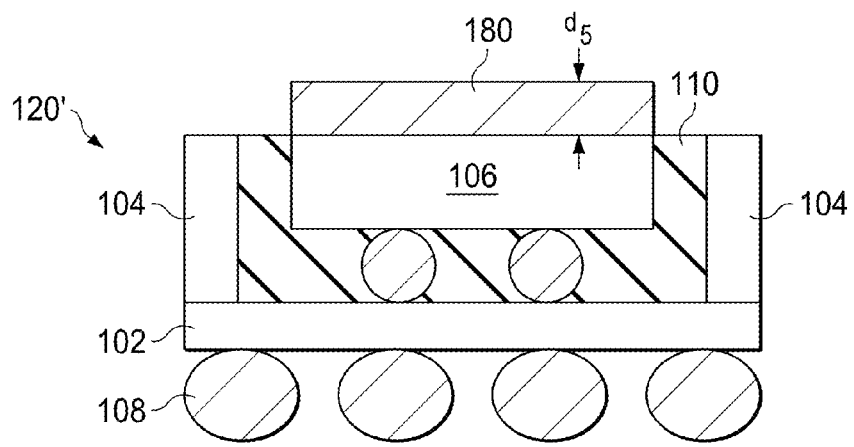

FIGS. 16 and 17 are cross-sectional views of packaged semiconductor devices 120' in accordance with some embodiments, wherein a lid 180 is included on the packages. The lid 180 is coupled to the integrated circuit die 106, the molding material 110, and/or the ring 104, in accordance with some embodiments of the present disclosure. For example, in FIG. 16, the packaged semiconductor device 120' includes a lid 180 that is coupled to a top surface of the ring 104, a top surface of the molding material 110, and a top surface of the integrated circuit die 106. In FIG. 17, the lid 180 is coupled to the top surface of the integrated circuit die 106. The lid 180 may be coupled to a combination of the integrated circuit die 106, the molding material 110, and/or the ring 104, in accordance with some embodiments.

The lid 180 comprises a heat-spreading or heat-sinking material such as a metal. The lid 180 may comprise copper or other metals, for example. The lid 180 has a thickness comprising dimension $d_5$, wherein dimension $d_5$ comprises about 0.5 mm to about 2 mm. The lid 180 is attached using an adhesive, a thermal interface material (TIM), an adhesive TIM, other materials, or a combination thereof, as examples. The lid 180 is attached in some embodiments after the molding material 110 is applied and/or cured, for example. Alternatively, the lid 180 may comprise other materials, dimensions, and attachment means.

In FIG. 16, the lid 180 is attached using a TIM 184 between the lid 180 and the integrated circuit die 106, and an adhesive 182 between the lid 180 and the molding material 110 and ring 104. In FIG. 17, the lid 180 is attached only to the integrated circuit die 106, using an adhesive 182 or TIM 184, not shown.

Some embodiments of the present disclosure include methods of packaging semiconductor devices. Other embodiments include packaged semiconductor devices that have been packaged using the novel methods described herein.

Some advantages of embodiments of the present disclosure include providing packaging structures and methods that include a ring attached to a package substrate. An integrated circuit die is attached to the substrate within the ring, and a molding material is applied around the die within the ring. The combined inclusion of the ring and the molding material provides improved warpage control for the packaged semiconductor device. The package structures are robust and decrease package warpage by their novel package structure design. Including a lid on the package further provides heat-spreading and heat-sinking for the package and the integrated circuit die.

Experimental results of implementing the ring and molding material in packaging structures comprising 35 mm×35 mm substrates resulted in a reduction in warpage at various stages of the packaging process, and also resulted in a reduction in overall package warpage. The warpage control of implementing the ring and molding material in the package was found to be comparable to warpage control provided by using only a lid on the package, without including the ring 104, for example. Including the lid on the package results in additional warpage control and also provides heat-spreading and heat-sinking. The lid also improves thermal performance, and the ring improves or reduces warpage and reduces mechanical strain. The improved warpage control achieved by embodiments of the present disclosure advantageously results in packaging devices that provide a substantially flat platform for 3DIC die stack process flows.

Embodiments of the present disclosure are particularly advantageous in larger sized FCBGA applications with a low profile form factor. Reduced and minimal package warpage, high throughput, and excellent thermal performance are provided. Stress on integrated circuit dies is reduced by utilizing the novel ring and molding material combination in the packages, which is particularly advantageous in applications wherein the integrated circuit dies include low dielectric constant (k) insulating materials or extra low-k insulating material, which have a k value less than a k value of silicon dioxide and may comprise relatively porous or fragile materials.

Package reliability lifetime and board level yields are increased by implementing embodiments of the present disclosure. Ball mount yields are improved with the reduced warpage resulting from embodiments of the present disclosure. Furthermore, the novel packaging methods and structures described herein are easily implementable in manufacturing and packaging process flows.

In some embodiments, a method of packaging a semiconductor device includes coupling a ring to a substrate, coupling an integrated circuit die to the substrate within the ring, and disposing a molding material around the integrated circuit die within the ring.

In some embodiments, a method of packaging a semiconductor device includes attaching a ring to a first surface of a substrate, and bonding an integrated circuit die to the first surface of the substrate in a region surrounded by the ring. A molding material is applied in the region surrounded by the ring. A plurality of connectors are mounted to a second surface of the substrate, the second surface being opposite the first surface.

In other embodiments, a packaged semiconductor device includes a substrate that has an integrated circuit die mounting region. A ring is coupled to the substrate around the integrated circuit die mounting region. An integrated circuit die is coupled to the integrated circuit die mounting region of the substrate within the ring. A molding material is disposed over the substrate around the integrated circuit die within the ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
    coupling a ring to a top surface of a rigid first substrate;
    coupling a plurality of integrated circuit dies to the top surface of the first substrate within the ring, wherein at least two of the plurality of integrated circuit dies are laterally adjacent, wherein the first substrate comprises a plurality of contact pads disposed on the top surface of the first substrate and the plurality of integrated circuit dies are coupled to the first substrate by a plurality of connectors disposed between the plurality of integrated circuit dies and the plurality of contact pads;
    disposing a molding material around the plurality of integrated circuit dies within the ring and simultaneously disposing the molding material beneath the plurality of integrated circuit dies within the ring;
    coupling a lid to the ring and the plurality of integrated circuit dies, wherein an adhesive fully extends vertically in a direction perpendicular to the top surface between the ring and the lid, wherein the adhesive fully extends vertically from the molding material to the lid, wherein the adhesive covers the molding material, wherein a thermal interface material (TIM) fully extends vertically from the integrated circuit die to the lid, wherein the adhesive is a different material than the TIM, and wherein the adhesive physically contacts the TIM; and
    coupling the bottom surface of the first substrate to a second substrate.

2. The method according to claim 1, wherein coupling the ring and coupling the plurality of integrated circuit dies comprise coupling the ring and coupling the plurality of integrated circuit dies to a first surface of the first substrate, and wherein the method further comprises coupling a plurality of connectors to a second surface of the first substrate, the second surface being opposite the first surface.

3. The method according to claim 1, wherein disposing the molding material comprises applying a material selected from the group consisting essentially of a molding compound, an underfill material, and combinations thereof.

4. The method according to claim 1, wherein coupling the plurality of integrated circuit dies to the first substrate comprises flip-chip mounting the plurality of integrated circuit dies to the first substrate.

5. The method according to claim 1, wherein the method comprises disposing the molding material around the plurality of integrated circuit dies after coupling the ring to the first substrate.

6. The method according to claim 5, wherein the method comprises first, coupling the ring to the first substrate, and second, coupling the plurality of integrated circuit dies to the first substrate.

7. The method according to claim 5, wherein the method comprises first, coupling the plurality of integrated circuit dies to the first substrate, and second, coupling the ring to the first substrate.

8. The method according to claim 1, wherein an outer diameter of the ring is less than or equal to a diameter of the lid.

9. A method of packaging a semiconductor device, the method comprising:
    attaching a ring to a top surface of a substrate;
    bonding a bottom surface of a first integrated circuit die to the top surface of the substrate in a region surrounded by the ring, wherein the bottom surface of the first integrated circuit is bonded to the top surface of the substrate by at least one conductive connector;
    applying a molding material in the region surrounded by the ring, wherein applying the molding material comprises simultaneously flowing the molding material to fill the space between the first integrated circuit die and the ring and flowing the molding material to fill the space between the top surface of the substrate and the bottom surface of the first integrated circuit die, wherein the molding material is fully contained within the interior volume defined by the ring;

bonding a second integrated circuit die to a top surface of the first integrated circuit die, wherein a top surface of the first integrated circuit die and a top surface of the ring are substantially level with a top surface of the molding material, and wherein a plurality of connectors disposed on the bottom surface of the second integrated die physically contact corresponding conductive pads disposed on the top surface of the first integrated circuit die; and mounting a plurality of connectors to a second surface of the substrate, the second surface being opposite the first surface.

10. The method according to claim 9, further comprising curing the molding material.

11. The method according to claim 9, further comprising bonding a third integrated circuit die to the second integrated circuit die.

12. The method according to claim 9, wherein a distance extending from an end of the top surface of the substrate to an opposite end of the top surface of the substrate is not greater than a distance of an outer diameter of the ring.

13. A method of packaging a semiconductor device, the method comprising:

mounting a ring to a substrate, wherein the substrate extends beyond an outer edge of the ring;

mounting a first die to the substrate with a plurality of conductive connectors;

introducing molding compound simultaneously around the first die and in a space between the ring and the first die to encapsulate the first die, wherein the molding compound is limited to the interior volume defined by the ring such that the outermost surface of the ring is free of molding compound and a top surface of the first die and a top surface of the ring are substantially level with a top surface of the molding compound; and mounting one or more other dies over the first die, wherein at least one of the one or more other dies is mounted onto a surface of the first die, comprising mounting connectors on the first die and the at least one of the one or more other dies to corresponding pads on the other of the first die and the at least one of the one or more other dies.

14. The method according to claim 13, wherein the step of mounting the ring to the substrate comprises attaching the ring to the substrate using an adhesive.

15. The method according to claim 13, wherein the step of mounting the first die to the substrate comprises mounting connectors on the first die and the substrate to corresponding pads on the other of the first die and the substrate and re-flowing the connectors.

16. The method according to claim 13, wherein the step of introducing the molding compound comprises a transfer molding process or a compression molding process.

17. The method according to claim 13, further comprising applying an underfill material between the first die and the substrate.

18. The method according to claim 13, further comprising mounting a plurality of laterally adjacent integrated circuit dies on the substrate, wherein the plurality of laterally adjacent integrated circuit dies comprises the first die, and wherein the ring surrounds the plurality of laterally adjacent integrated circuit dies.

19. The method according to claim 13, further comprising introducing the molding compound in a space between the first die and the substrate.

\* \* \* \* \*